United States Patent
Zhuang et al.

(10) Patent No.: US 7,674,350 B2
(45) Date of Patent: Mar. 9, 2010

(54) FEATURE DIMENSION CONTROL IN A MANUFACTURING PROCESS

(75) Inventors: Haoren Zhuang, Hopewell Junction, NY (US); Alois Gutmann, Poughkeepsie, NY (US); Matthias Lipinski, Poughkeepsie, NY (US); Chandrasekhar Sarma, Poughkeepsie, NY (US); Jingyu Lian, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 262 days.

(21) Appl. No.: 11/625,575

(22) Filed: Jan. 22, 2007

(65) Prior Publication Data

US 2008/0176344 A1    Jul. 24, 2008

(51) Int. Cl.
*H01L 21/66* (2006.01)
*C23F 1/08* (2006.01)

(52) U.S. Cl. ............... 156/345.22; 156/345.24; 156/345.31

(58) Field of Classification Search ............ 438/8, 438/9; 156/345.22, 345, 24, 345.31
See application file for complete search history.

(56) References Cited

U.S. PATENT DOCUMENTS

| | | | |
|---|---|---|---|
| 6,812,044 B2 * | 11/2004 | Chiu et al. | 438/8 |
| 7,098,140 B2 * | 8/2006 | Schaller et al. | 438/706 |
| 7,361,599 B2 * | 4/2008 | Moise et al. | 438/689 |
| 2004/0241561 A1 | 12/2004 | Chen et al. | |
| 2005/0174575 A1 | 8/2005 | Norton et al. | |

* cited by examiner

*Primary Examiner*—Evan Pert
(74) *Attorney, Agent, or Firm*—Banner & Witcoff, Ltd.

(57) ABSTRACT

A method for manufacturing a semiconductor device is disclosed including determining a dimension or other physical characteristic of a pattern in a layer of material that is disposed on a workpiece, and etching the layer of material using information that is related to the dimension. A system is also disclosed for manufacturing a semiconductor device including a first etch system configured to etch a layer to define a pattern in the layer, and a second etch system configured to measure a physical characteristic of the pattern, determine an etch control parameter based on the physical characteristic, and etch the layer in accordance with the etch control parameter.

18 Claims, 4 Drawing Sheets

FEATURE DIMENSION CONTROL IN A MANUFACTURING PROCESS

BACKGROUND

As the semiconductor device market continues to grow and become more competitive, the equipment and processes for manufacturing semiconductor devices are likewise maturing. To keep pace with competition, there is a need for manufacturing processes to be as efficient as possible. Reducing the amount of time, energy, and materials used for manufacture may increase manufacturing efficiency. Accordingly, there has been an expanding effort to reduce the amount of resources used in the manufacturing process. In addition, as semiconductor feature dimensions become ever smaller, it is becoming increasingly difficult to accurately control these dimensions within a narrow range in an efficient and highly repeatable manner.

As part of this effort to increase manufacturing efficiency while maintaining control of feature size, control mechanisms, known in the field as advanced process control (APC) mechanisms, allow various portions of the manufacturing process to be measured and adjusted.

APC mechanisms are often embodied as devices known as integrated metrology modules (IMMs), which are essentially sensors and data processors used in conjunction with various steps in the manufacturing processes. These IMMs take specified measurements during the manufacturing process to determine whether certain errors occur during a manufacturing step. The results of these measurements, which may be fed backward or forward in the manufacturing process, are used as a basis to adjust other aspects of manufacturing in an attempt to compensate for such errors.

Such APC mechanisms also typically measure a send-ahead (SAHD) wafer. A wafer is a planar piece of semiconductor material, typically disc-shaped, that is the substrate on (and in) which semiconductor devices are formed. A SAHD wafer is, in essence, a sacrificial wafer that is used to test-run at least a portion of the manufacturing process so that the manufacturing steps may be adjusted prior to sending future wafers intended for actual marketable semiconductor devices. A SAHD wafer is used for each "run" of wafers, which is typically a group of about twenty or so wafers, although a run may be any number of wafers. In other words, for each run, at least one wafer may be wasted, thereby reducing efficiency. This reduced efficiency is especially problematic where, as is typically the case, the profit margin for the end product is small.

SUMMARY

The following presents a simplified summary in order to provide a basic understanding of various aspects described herein. This summary is not an extensive overview of the invention. It is not intended to identify key or critical elements of the invention or to delineate the scope of the invention. The following summary merely presents various concepts in a simplified form as a prelude to the more detailed description provided below.

In one illustrative aspect, a method for manufacturing a semiconductor device includes determining a dimension or other physical characteristic of a pattern in a layer of material that is disposed on a workpiece, and etching the layer of material using information that is related to the dimension.

According to another illustrative aspect, a system for manufacturing a semiconductor device includes a first etch system configured to etch a layer to define a pattern in the layer, and a second etch system configured to measure a physical characteristic of the pattern, determine an etch control parameter based on the physical characteristic, and etch the layer in accordance with the etch control parameter.

These and other aspects of the disclosure will be apparent upon consideration of the following detailed description of illustrative aspects.

BRIEF DESCRIPTION OF THE DRAWINGS

A more complete understanding of the present disclosure may be acquired by referring to the following description in consideration of the accompanying drawings, in which like reference numbers indicate like features, and wherein.

It is noted that the various drawings are not necessarily drawn to scale.

DETAILED DESCRIPTION

The various aspects summarized previously may be embodied in various forms. The following description shows, by way of illustration, various embodiments in which the aspects may be practiced. It is understood that other examples may be utilized, and that structural and functional modifications may be made, without departing from the scope of the present disclosure. It is noted that various layers are set forth as being adjacent to one another in the following description. Unless otherwise specified, such layers may be directly and physically in contact with each other or a material may intervene between such layers, and in any event this specification is not intended to be limiting in this respect.

Traditional post-lithography/pre-etch advanced process control (APC) mechanisms measure critical dimensions (CDs) of semiconductor device features. Data representing these measurements ("CD data") is used to compensate for lithography drifts that a wafer experiences during the lithographic processing of transistor polysilicon gate lines.

Traditional feed-forward mechanisms are intended to compensate for polysilicon line lithography drifts (that can vary from wafer to wafer) by forwarding the CD data to a later component in the manufacturing process that etches the material from which the polysilicon lines are formed.

Figure 2:
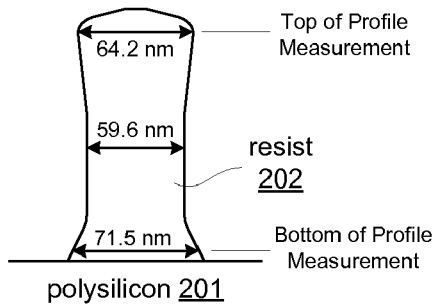
FIG. 2 is a side cut-away view of an illustrative embodiment of a semiconductor device structure showing illustrative critical dimension measurements of a resist layer after lithographic patterning of the resist and prior to polysilicon gate line etching.

However, the above feed-forward process may not, in practice, adequately compensate for lithography drift. For example, the measured CD at this post-lithography/pre-etch stage of manufacturing may be inconsistent due to variations in the resist profile being measured. Such variations may be due to resist local profile and footing variations, such as shown in FIG. 2, in which a portion of a photo-sensitive resist layer 202 formed above a layer of polysilicon 201 has a width that varies due to resist footing variations as well as local profile variations. Because of this profile variation, consistently measuring the CD at the same location of a given feature is difficult and not necessarily repeatable.

In addition to the post-lithography/pre-etch feed-forward loop, many traditional post-etch processes utilize a feedback loop to compensate for etching drifts. For a given run of wafers, such an approach uses a send-ahead (SAHD) wafer for measurement and uses those measurements to adjust etching characteristics. Such an approach may be inconsistent between wafers, since measurements of only a single SAHD wafer are being used to control adjustments made for the etching process of other wafers in the run. Since each wafer may have slightly different CD measurement results, data from the SAHD wafer may not effectively reflect adjustments needed to each of the other wafers in the run. For this reason, feedback techniques are not useful for correcting for wafer-to-wafer variations. Still further, the SAHD wafer is not useful for providing marketable ICs, since the drifts thereon are uncompensated. The SAHD is merely used to establish the feedback control data used for etching the other wafers during a run. Therefore, for each run a wafer is wasted.

In an alternative approach, as will be described in connection with various illustrative embodiments, material line pattern etching may be separated into two distinct etching steps. In some embodiments, the material is polysilicon. In some embodiments, the first etching step may be a reactive ion etching (RIE) etch step. In alternative embodiments, the first etching step may be performed using any suitable type of etch system that can perform any type of anisotropic etching or other type of etching. The second etching step may account for any variations in dimensions or other physical characteristics measured after the first etch step. In some embodiments, the second etching step may use chemical downstream etching (CDE). In other embodiments, the second etching step may use any type of isotropic or other type of etching. Thus, scatterometry measurements after lithography may be skipped and replaced with a feed-forward measurement. This means that, for purposes of patterning a polysilicon layer, only a single measurement may be used, thus effectively resulting in an etch-measure-etch process.

In addition, since state-of-the-art logic transistor gate patterning already involves a CD trim process (where the CD is reduced beyond what is normally achievable through lithography alone), at least one of the two etch steps may also provide for this CD trim capability. For example, CDE may be used for both the second etching step and CD trimming. Because CDE is generally well controllable, provides for isotropic (i.e., omnidirectional) etching, and is highly repeatable, CDE is particularly suitable for compensating with high accuracy for deviations from target as measured after the first etching step.

Figure 1:
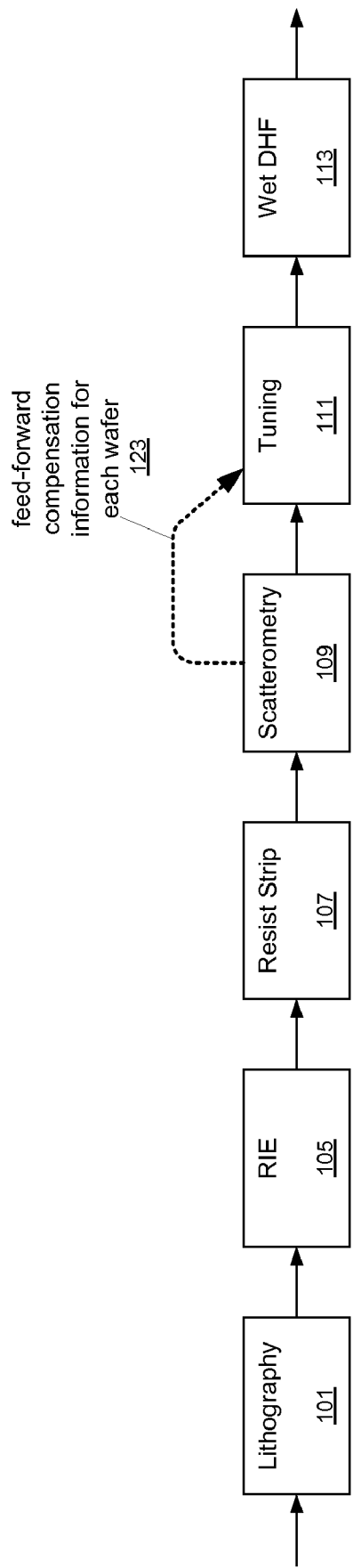
FIG. 1 is a flow chart of an illustrative embodiment of a semiconductor device manufacturing process including various APC processes.

An illustrative embodiment of such an etch-measure-etch process is now described with respect to FIG. 1. For each wafer or other work piece in a run (which may be a set of any number of wafers, such as at least ten wafers, at least twenty wafers, at least thirty wafers, or any other number as desired), lithography 101 may be performed on each wafer, such that a pattern from a reticle or other type of photomask is optically transferred to a photo-sensitive layer (also known as a resist layer) formed on the wafer. The pattern may be transferred by projecting onto the resist layer an ultra-violet (UV) light or other wavelength image of the pattern formed on the reticle. Typically, multiple identical separate integrated circuits are formed on the same wafer, and so the image projected onto the wafer includes a number of repeated smaller images. To expose the resist-coated wafer, either a single larger image may be projected onto the wafer simultaneously for all of the integrated circuits in the wafer, or a smaller image may be repetitively exposed in a step-wise manner on successive portions of the wafer representing the different integrated circuits. The type of exposure used may depend upon the type of photomask and projection equipment used. In either case, exposure may be implemented in a conventional stepper machine that moves the wafer in steps under a scanning region.

Figure 5:
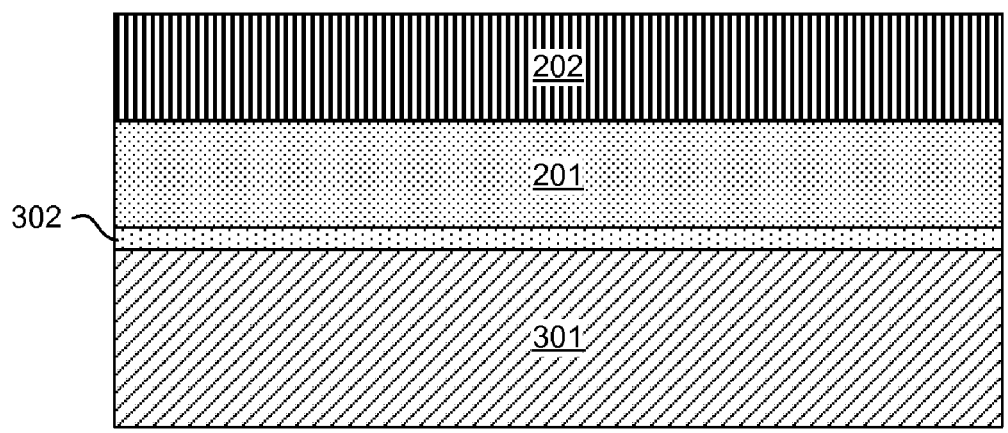
FIG. 5 is a side cut-away view of an illustrative embodiment of a semiconductor device structure prior to photolithography patterning of a resist layer.
Figure 6:
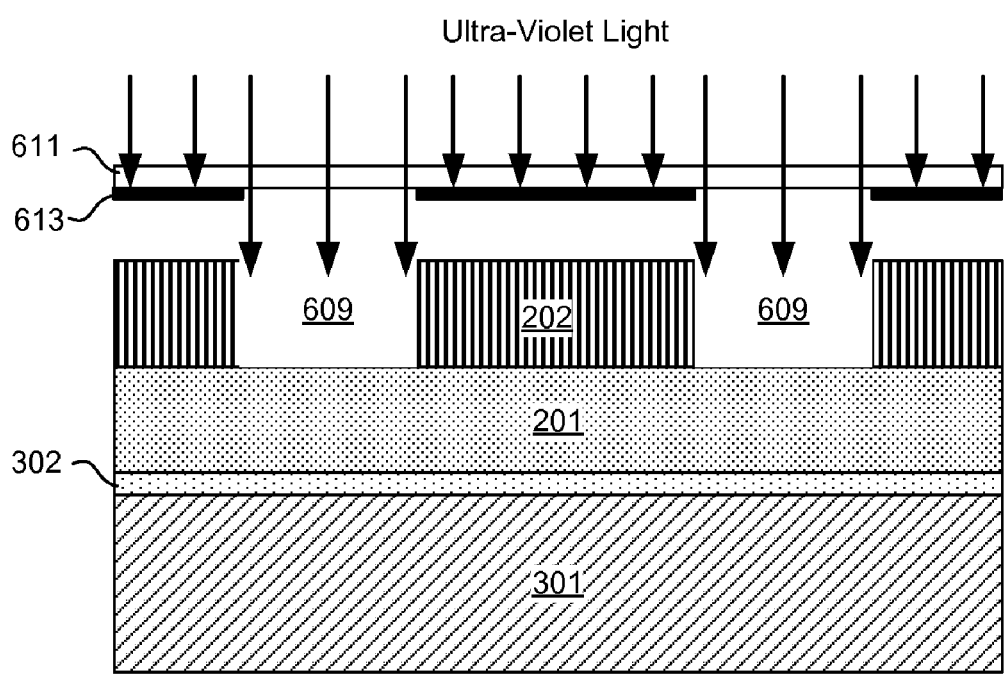
FIG. 6 is a side cut-away view of the semiconductor device of FIG. 5 during the photolithography patterning of the resist layer.

For instance, referring to FIGS. 1 and 5, a resist layer 202 may be formed as a blanket layer over a polysilicon layer 201 or other conductive layer, which may itself be formed as a blanket layer over an insulating (e.g., oxide) layer 302, which in turn may be formed as a blanket layer over a silicon layer 301 or other substrate. Referring to FIGS. 1 and 6, this structure may then be exposed to a UV or other wavelength image (indicated in FIG. 6 by vertical arrows) as determined by a pattern formed on a reticle 611 or other photomask. In this example, reticle 611 is made of an optically transparent substance such as quartz glass, and the pattern may be embodied as a patterned layer of opaque material 613 layered on the glass, such as chrome. The result of projecting the image onto resist layer 202 is to chemically alter the exposed portions of resist layer 202 to affect how easily those portions can be removed from underlying polysilicon layer 201. After such removal, the result is a pattern in resist layer 202 including one or more openings 609 that expose respective underlying portions of polysilicon layer 201.

Next, referring only to FIG. 1, polysilicon etching 105, such as RIE or another type of etching, may be performed to etch those portions of polysilicon layer 201 exposed by the pattern in resist layer 202. In some embodiments, this is the first etching step of the etch-measure-etch process referred to previously. In some embodiments, this first etching step 105 may be performed to such an extent so as to allow for fine-adjustment etching of polysilicon layer 201 in a second etching step described later. There are various ways to determine one or more etching parameters such as etch rate and etch time for etching step 105. For instance, based on a sufficiently large volume of scatterometry data previously collected from initial runs including the whole patterning sequence (lithography and etching), the total dimensional variation from lithography and RIE etching arising during manufacturing will be known on both a run-to-run and a wafer-to-wafer basis. The etch control parameters of RIE etching step 105 may then be set at values that allow for compensation of any conceivable extent of run-to-run and wafer-to-wafer dimensional (e.g., CD) variation by the second etching step.

Figure 7:
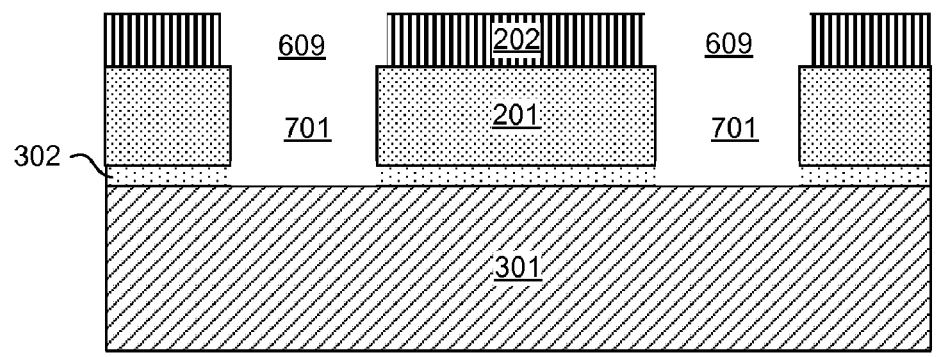
FIG. 7 is a side cut-away view of the semiconductor device of FIG. 6 after etching exposed polysilicon to form gate lines and/or other polysilicon structures.

Referring to FIGS. 1 and 7, due to the anisotropic nature of RIE, etching step 105 may result in one or more openings 701 in polysilicon layer 201 (and in oxide layer 302) substantially aligned with openings 609. However, as can be seen in the example of FIG. 7, the amount of polysilicon layer 201 removed during etching step 105 may be less than desired such that openings 701 are narrower than intended. This is indicated in FIG. 7 where polysilicon layer 201 extends beyond the edges of openings 609 in resist layer 202. As will be described below, this may be compensated for later in the manufacturing process on a wafer-by-wafer basis for each and every wafer in a run, without the need for a sacrificial SAHD wafer.

Figure 8:
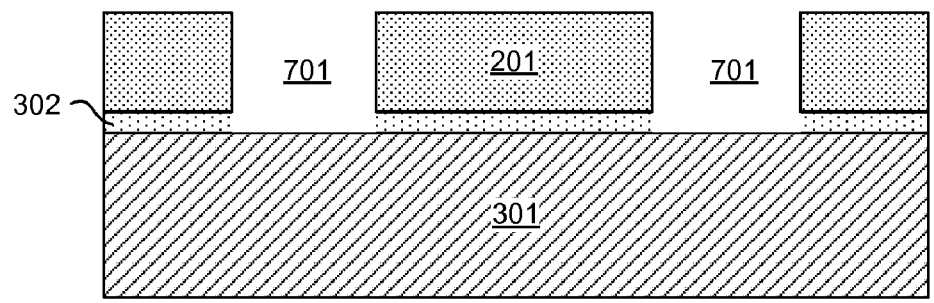
FIG. 8 is a side cut-away view of the semiconductor device of FIG. 7 after stripping off the resist layer.

Next, referring to FIGS. 1 and 8, resist layer 202 may be stripped from the wafer using, for example, ashing or CDE (step 107). In some embodiments, a scatterometer may be used to take a measurement in step 109. In further embodiments, an ellipsometer, a reflectometer, or a scanning electron microscope, may be used. In some embodiments, the measurement may be a direct measurement, and in other embodiments the measurement may be an indirect measurement. In either case, the measurement may be performed to measure or otherwise determine one or more physical characteristics of the pattern in polysilicon layer 201 at one or more different locations of polysilicon layer 201, such as one or more critical dimensions of the pattern in polysilicon layer 201. Regardless of how this measurement is taken, feed-forward compensation information 123 may be generated based on the measurement, wherein feed-forward compensation information 123 represents the one or more measured physical characteristics and/or the adjustments to or other settings of one or more etching parameters needed to correct for any under-etching.

Feed-forward compensation information 123 is then fed forward (indicated in FIG. 1 with a broken line) as a control to adjust one or more etching parameters of an additional etching process that fine-tunes polysilicon layer 201, referred to herein as tuning (step 111). Any one or more etching parameters may be adjusted in accordance with compensation information 123. For instance, in some embodiments, an etching parameter may include the temperature of the wafer. In further embodiments, an etching parameter may include the chemical makeup of the etchant(s) used. In still further embodiments, an etching parameter may include the etching gas pressure. In still further embodiments, an etching parameter may include the etching chamber volume. In yet further embodiments, an etching parameter may include the amount of time etching is performed.

Tuning 111 may include any type of etching process, such as CDE and/or another type of etching. In the CDE process, a gas stream is used to etch the wafer. Because ions do not directly impinge upon the wafer during this process, isotropic etching is achieved by radicals from the gas stream. Isotropic etching may be ideal for performing tuning step 111. Moreover, CDE etching is generally slower than RIE etching, and so very accurate adjustments can be made to the CDE etching process as compared with RIE etching. It has been found that the amount of time that CDE is performed varies approximately linearly with the amount of polysilicon line trimming.

Regardless of the type of etching used in tuning 111, one or more etch control parameters of tuning 111 may be adjusted or otherwise set based on feed-forward compensation information 123. In some embodiments, if feed-forward information 123 indicates that polysilicon layer 201 includes transistor gate lines that are wider than desired (i.e., that have been under-etched), then the etch control parameters in tuning 111 may be adjusted or otherwise set so as to additionally etch an appropriate amount of polysilicon layer 201 to produce the desired gate line width. In various embodiments, the etch control parameters can be individually tailored for each wafer in the run.

Figure 9:
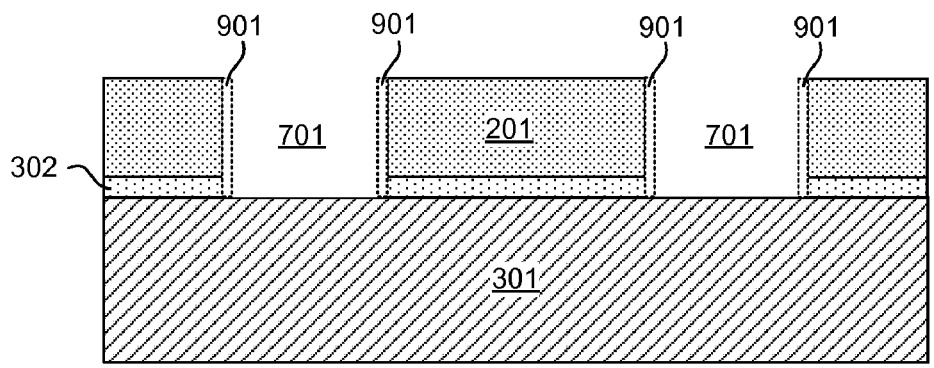
FIG. 9 illustrates a side cut-away view of the semiconductor device of FIG. 8 after wet etching of the polysilicon layer.

As mentioned previously, feed-forward compensation information 123 may be used to determine one or more etch control parameters during tuning 111, which may be used to remove an additional amount of polysilicon layer 201 after RIE 105, such as portions 901 as shown in FIG. 9. This is the second etching step of the etch-measure-etch process referred to previously. The etch control parameters may involve, for example, the amount of time that etching is performed, the pressure levels of one or more gases used during etching, and/or the temperature level used during etching. Any of a number of different etching parameters affiliated with etching may be adjusted or otherwise set, and the illustrative examples provided herein should not be considered limiting.

The resist strip 107, scatterometry 109, and tuning 111 steps may be performed by separate devices or by a single integrated device or etch system. For instance, these three steps 107, 109, 111 may be performed by a modified CDE tool having an IMM that may include a scatterometer and a processor, and that may further include automated etch control parameter adjustment capabilities based on the output of the processor. In such a case, each wafer being processed may remain in the chemical downstream etcher throughout processes 107, 109, and 111.

After performing tuning 111, each wafer may be treated with dilute hydrofluoric acid (DHF), for example, to remove the pad oxide layer from the wafer in step 113. The wafer may be further dipped in an acid bath and a deionized water rinse bath as desired.

In the process in accordance with FIG. 1, it is not necessary to provide a sacrificial SAHD wafer. In some embodiments, one or more feed-forward controls can be used in the process shown in FIG. 1. In some embodiments, one or more feedback controls can be used in the process shown in FIG. 1. In some embodiments, the measurements taken for each wafer may be applied to compensate for errors occurring on those same wafers. Thus, corrections may be made on a wafer-by-wafer basis. Thus, each and every wafer in a run in accordance with FIG. 1 has a reasonable potential to be a source of marketable integrated circuits.

Figure 3:
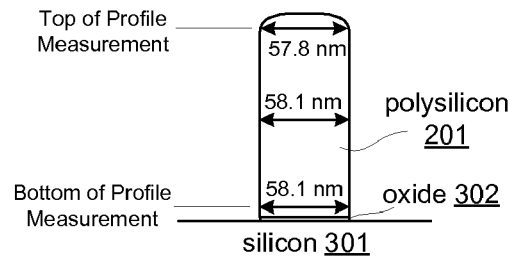
FIG. 3 is a side cut-away view of an illustrative embodiment of a semiconductor device structure showing illustrative critical dimension measurements of a polysilicon gate line after gate line etching and stripping of remaining resist.

In addition, and in accordance with FIG. 1, scatterometry step 109 may be performed on the wafer after resist layer 202 is stripped and polysilicon layer 201 is etched. This may allow for more accurate dimensional measurements as compared to measurements made in the presence of resist layer 202 still remaining on polysilicon layer 201. For instance, referring briefly to FIG. 3, it can be seen that the profile width of the pattern in polysilicon layer 201 (disposed above a silicon 301 substrate) has a relatively small variance along the bottom, middle, and top of the pattern profile as compared with the profile of the pattern in resist layer 202 (FIG. 2). This reduced variance may be due at least in part to passivation effects that occur during etching of polysilicon layer 201. Since passivation may not be present when patterning resist layer 202, a scatterometry measurement of polysilicon layer 201 in the absence of resist layer 202 may provide a marked improvement in dimensional metrology accuracy as compared with traditional pre-etch scatterometry.

Figure 4:
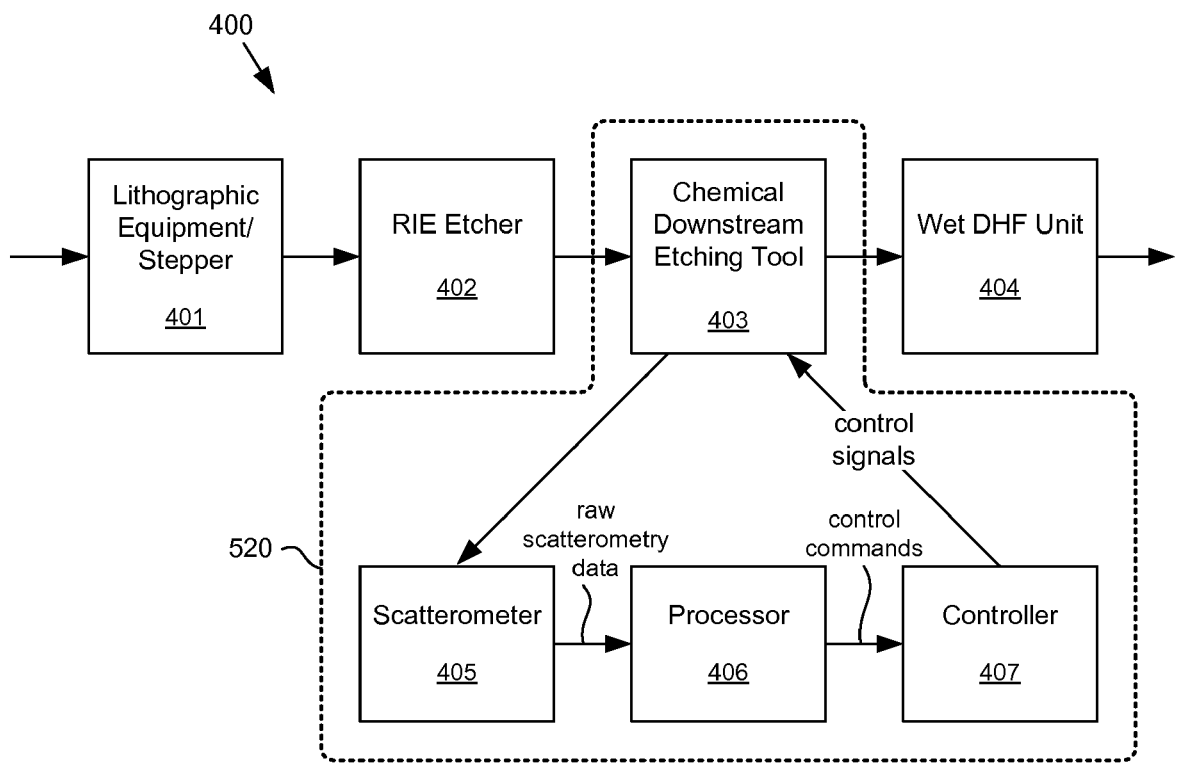
FIG. 4 is a functional block diagram of an illustrative embodiment of a system for manufacturing semiconductor devices and implementing various APC processes.

Referring now to FIG. 4, an illustrative functional block diagram of a system 400, or portion thereof, is shown that may be used for manufacturing semiconductor devices from a run of wafers in accordance with the process of FIG. 1. System 400 as shown includes lithography equipment 401 for performing step 101 by patterning resist layer 202. Lithography equipment 401 may include a UV or other wavelength light projector, a holder for a reticle or other type of photomask, and a stepper for moving the wafer in relation to the projector in a controlled manner. System 400 may further include a first etcher (such as an RIE etcher 402), which may receive the wafer from lithographic equipment 401. RIE etcher 402 may perform step 105 so as to remove the exposed portions of polysilicon layer 201 from the wafer.

System 400 may additionally include a second etcher (such as a CDE tool 403), which may be used to perform at least step 107 to strip the remaining resist layer 202 after etching polysilicon layer 201. A scatterometer 405 may then be used to perform step 109 by measuring the stripped wafer and generating raw scatterometry data from the measurements. The raw scatterometry data may represent at least one or more measured critical dimensions of the pattern in polysilicon layer 201. Then, a processor 406 may receive the raw scatterometry data and generate one or more control commands based on the raw scatterometry data. For instance, based on the raw scatterometry data, processor 406 may make a determination that the etching temperature should be set at a specific temperature, that the gas pressure within the etching chamber needs to be set at a specific pressure, that a specific amount of time for subsequent etching needs to be set, and/or some other etching parameter needs to be adjusted. These adjustments and other settings may be represented by the control commands generated by processor 406.

A controller 407 may also be included that converts the control commands to control signals that are appropriate for directly adjusting etch control parameters of CDE tool 403. Alternatively, processor 406 may produce the control signals directly without the need for intervening control commands (such as where processor 406 and control 407 are a combined unit). CDE tool 403, scatterometer 405, processor 406 and/or controller 407 may be packaged as a single physical unit in a single common housing 520 (such as a cluster tool) or may be separate physical units. Also, adjustment of the various etch control parameters of CDE tool 403 may be fully automated via processor 406 and/or controller 407 and/or the etch control parameters may be manually adjustable.

In response to the control signals, the etch control parameters may be adjusted or otherwise set, and CDE tool 403 may again perform an etch in accordance with the new etch control parameters to perform step 111 (tuning). It is noted that any of the raw scatterometry data, control commands, or control signals of FIG. 4, alone or in any combination, may be considered to be at least part of the feed-forward compensation information 123 of the process of FIG. 1. After the desired amount of tuning (e.g., CD trimming) is performed, the wafer may then undergo a wet DHF treatment (step 113) by a wet DHF unit 404.

Thus, various illustrative systems and methods for manufacturing semiconductor devices using a post-resist-strip feed-forward adjustment mechanism have been described. Although the above description has been presented in the context of controlling the dimensions of polysilicon features, the description applies equally to controlling feature dimensions of other materials. Where such other materials are controlled in accordance with the present disclosure, the various specific formation and/or etching techniques may be applied and/or modified as appropriate to those materials and as understood by one of ordinary skill in the relevant art. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. Moreover, although various embodiments may be separately disclosed, any of the embodiments may be combined in any combination or subcombination as would be recognized by one of ordinary skill in the art.

What is claimed is:

1. A system for manufacturing a semiconductor device, comprising:
   a first etch system configured to etch a layer to define a pattern in the layer; and
   a second etch system configured to measure a physical characteristic of the pattern, determine an etch control parameter based on the physical characteristic, and etch the layer in accordance with the etch control parameter.

2. The system of claim 1, wherein the first etch system comprises a reactive ion etcher.

3. The system of claim 1, wherein the second etch system is configured to perform a chemical downstream etch process to etch the layer.

4. The system of claim 1, wherein the second etch system comprises a scatterometer configured to detect the physical characteristic.

5. A system for manufacturing a semiconductor wafer, comprising:
   means for etching a layer to define a pattern in the layer; and
   means for measuring a physical characteristic of the pattern;
   means for determining an etch control parameter based on the physical characteristic; and
   means for etching the layer in accordance with the etch control parameter.

6. The system of claim 1, wherein the first etch system is configured to perform anisotropic etching of the layer, and the second etch system is configured to perform isotropic etching of the layer in accordance with the etch control parameter.

7. The system of claim 1, wherein the first etch system is configured to perform reactive ion etching of the layer, and the second etch system is configured to perform chemical downstream etching of the layer in accordance with the etch control parameter.

8. The system of claim 1, wherein the first etch system is configured to perform a first type of etching, and the second etch system is configured to perform a second type of etching, different from the first type of etching, in accordance with the etch control parameter.

9. The system of claim 1, wherein the second etch system is a different physical etch system than the first etch system.

10. The system of claim 1, wherein the second etch system is configured to measure the physical characteristic of the pattern after the first etch system has stopped etching the layer.

11. The system of claim 1, wherein the physical characteristic comprises a width of a feature formed in the pattern of the layer.

12. The system of claim 5, wherein the means for etching the layer to define the pattern in the layer is for performing anisotropic etching of the layer, and the means for etching the layer in accordance with the etch control parameter is for performing isotropic etching of the layer in accordance with the etch control parameter.

13. The system of claim 5, wherein the means for etching the layer to define the pattern in the layer is for performing reactive ion etching of the layer, and the means for etching the layer in accordance with the etch control parameter is for performing chemical downstream etching of the layer in accordance with the etch control parameter.

14. The system of claim 5, wherein the means for etching the layer to define the pattern in the layer is for performing a first type of etching, and the means for etching the layer in accordance with the etch control parameter is for performing a second type of etching, different from the first type of etching, in accordance with the etch control parameter.

15. The system of claim 5, wherein the means for etching the layer in accordance with the etch control parameter is a different physical etch system than the means for etching the layer to define the pattern in the layer.

16. The system of claim 5, wherein the means for determining is for determining the etch control parameter after the means for etching the layer to define the pattern in the layer has stopped etching the layer.

17. The system of claim 5, wherein the physical characteristic comprises a width of a feature formed in the pattern of the layer.

18. A system for manufacturing a semiconductor device, comprising:
   a first etch system configured to etch a layer disposed on a substrate to define a pattern in the layer; and
   a second etch system configured to physically receive the etched substrate after etching is completed by the first etch system, to measure a feature width of the pattern in the layer on the received substrate, and to etch the layer in a manner based on the measured feature width.

* * * * *